United States Patent
Yoshida et al.

(10) Patent No.: US 9,865,797 B2
(45) Date of Patent: Jan. 9, 2018

(54) RESONANT TRANSDUCER, MANUFACTURING METHOD THEREFOR, AND MULTI-LAYER STRUCTURE FOR RESONANT TRANSDUCER

(71) Applicant: YOKOGAWA ELECTRIC CORPORATION, Musashino-shi, Tokyo (JP)

(72) Inventors: Takashi Yoshida, Tokyo (JP); Takeshi Mishima, Tokyo (JP); Shigeto Iwai, Tokyo (JP); Yuusaku Yoshida, Tokyo (JP)

(73) Assignee: Yokogawa Electric Corporation, Tokyo (JP)

( * ) Notice: Subject to any disclaimer, the term of this patent is extended or adjusted under 35 U.S.C. 154(b) by 654 days.

(21) Appl. No.: 14/446,602

(22) Filed: Jul. 30, 2014

(65) Prior Publication Data

US 2015/0042208 A1     Feb. 12, 2015

(30) Foreign Application Priority Data

Aug. 7, 2013  (JP) .................................. 2013-164612

(51) Int. Cl.
| | | |
|---|---|---|
| *H01L 41/083* | (2006.01) | |
| *H01L 41/331* | (2013.01) | |
| *H03H 3/007* | (2006.01) | |
| *H03H 9/10* | (2006.01) | |

(52) U.S. Cl.
CPC .......... *H01L 41/083* (2013.01); *H01L 41/331* (2013.01); *H03H 3/0072* (2013.01); *H03H 9/1057* (2013.01); *Y10T 29/42* (2015.01)

(58) Field of Classification Search
CPC . H01L 41/083; H01L 41/331; H01L 41/0831; H01L 41/08333; H01L 41/0838; H03H 3/0072; H03H 9/1057
USPC ........................................................ 310/321
See application file for complete search history.

(56) References Cited

U.S. PATENT DOCUMENTS

| | | |
|---|---|---|
| 5,123,282 A | 6/1992 | Ikeda et al. |
| 5,581,038 A | 12/1996 | Lampropoulos et al. |
| 7,277,267 B1 | 10/2007 | Bonin |
| 8,222,065 B1 | 7/2012 | Smeys et al. |

(Continued)

FOREIGN PATENT DOCUMENTS

| | | |
|---|---|---|
| CN | 103130179 A | 6/2013 |
| DE | 10005555 A1 | 8/2001 |

(Continued)

*Primary Examiner* — Bryan Gordon
(74) *Attorney, Agent, or Firm* — Sughrue Mion, PLLC

(57) ABSTRACT

A resonant transducer includes a silicon single crystal substrate, a silicon single crystal resonator disposed over the silicon single crystal substrate, a shell made of silicon, surrounding the resonator with a gap, and forming a chamber together with the silicon single crystal substrate, an exciting module configured to excite the resonator, a vibration detecting module configured to detect vibration of the resonator, a first layer disposed over the chamber, the first layer having a through-hole over the resonator, a second layer disposed over the first layer, the second layer covering a gap being positioned above the through-hole and being communicated with the through-hole, and a third layer covering the first layer and the second layer, and the third layer sealing the gap.

10 Claims, 16 Drawing Sheets

(56) References Cited

U.S. PATENT DOCUMENTS

| | | | |
|---|---|---|---|
| 8,445,977 B2 | 5/2013 | Yoshida | |
| 2008/0041607 A1* | 2/2008 | Robert | B81C 1/00293 |
| | | | 174/50.5 |
| 2009/0167107 A1 | 7/2009 | Huang | |
| 2012/0060607 A1 | 3/2012 | Yoshida | |
| 2013/0002244 A1 | 1/2013 | Quevy | |
| 2013/0139377 A1* | 6/2013 | Noda | H04R 31/00 |
| | | | 29/594 |
| 2013/0214366 A1* | 8/2013 | Naito | H01L 29/84 |
| | | | 257/415 |
| 2014/0197712 A1* | 7/2014 | Yoshida | H03H 3/0072 |
| | | | 310/300 |

FOREIGN PATENT DOCUMENTS

| | | |
|---|---|---|
| EP | 1 544 162 A1 | 6/2005 |
| EP | 2428783 A1 | 3/2012 |
| FR | 2864340 A1 | 6/2005 |
| JP | 2005-37309 A | 2/2005 |
| JP | 2012-058127 A | 3/2012 |
| WO | 01/58804 A2 | 8/2001 |

* cited by examiner

RESONANT TRANSDUCER, MANUFACTURING METHOD THEREFOR, AND MULTI-LAYER STRUCTURE FOR RESONANT TRANSDUCER

BACKGROUND OF THE INVENTION

Field of the Invention

The present invention relates to a resonant transducer, a manufacturing method therefor, and a multi-layer structure for a resonant transducer.

Priority is claimed on Japanese Patent Application No. 2013-164612, filed Aug. 7, 2013, the content of which is incorporated herein by reference.

Description of Related Art

A resonant transducer has been known as a sensor for detecting physical stress. For example, the resonant transducer includes a vacuum chamber, a microscopic resonator disposed in the chamber, and a vibration detector detecting vibrations of the microscopic resonator. As shown in Japanese Unexamined Patent Application Publication No. 2012-58127, the chamber, the microscopic resonator, and the vibration detector are disposed in a silicon substrate (silicon wafer).

SUMMARY OF THE INVENTION

A resonant transducer may include a silicon single crystal substrate, a silicon single crystal resonator disposed over the silicon single crystal substrate, a shell made of silicon, surrounding the resonator with a gap, and forming a chamber together with the silicon single crystal substrate, an exciting module configured to excite the resonator, a vibration detecting module configured to detect vibration of the resonator, a first layer disposed over the chamber, the first layer having a through-hole over the resonator, a second layer disposed over the first layer, the second layer covering a gap being positioned above the through-hole and being communicated with the through-hole, and a third layer covering the first layer and the second layer, and the third layer sealing the gap.

DETAILED DESCRIPTION OF THE INVENTION

Before describing some embodiments, the related art will be explained with reference to one or more drawings, in order to facilitate the understanding of the embodiments.

Figure 25:
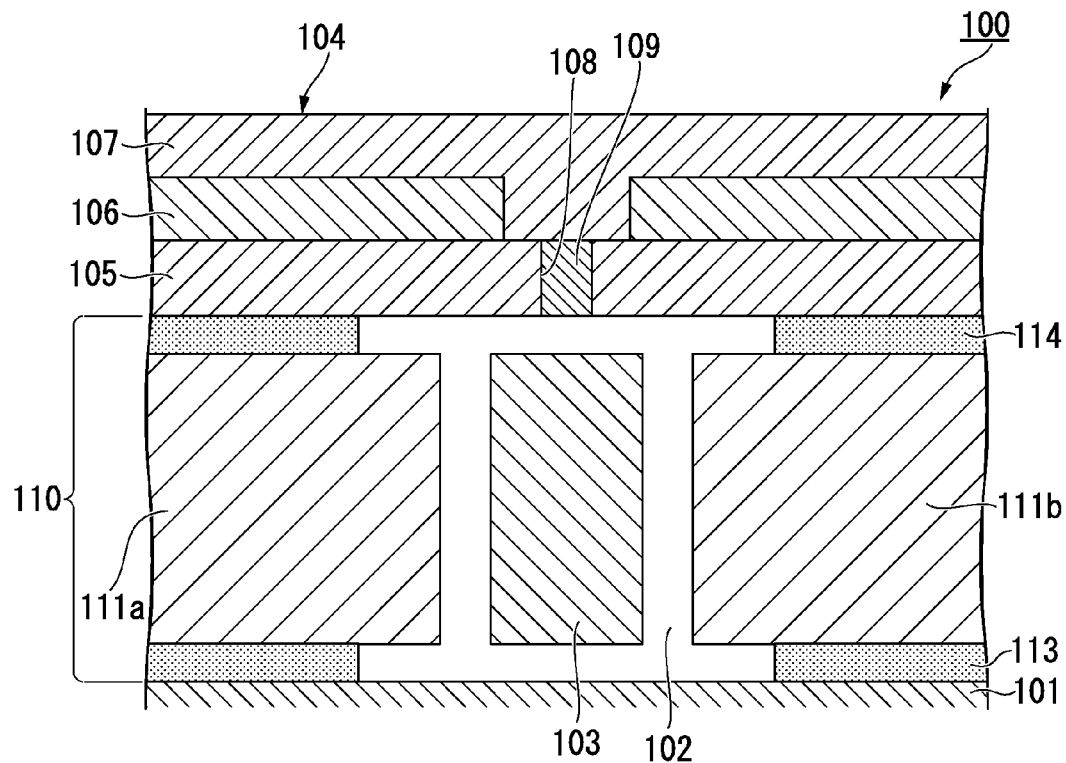
FIG. 25 is an exemplary sectional view illustrating a main part of the resonant transducer in the related art.

FIG. 25 is a drawing showing an example of a resonant transducer 100 in the related art. The resonant transducer 100 shown in FIG. 25 includes a silicon substrate 101 for a measurement diaphragm. The resonant transducer 100 also includes a multi-layer structure 110 over the substrate 101. The multi-layer structure 110 includes oxidized layer 113 and insulated layer 114. The multi-layer structure 110 also includes first electrode 111a and second electrode 111b, which are above the oxidized layer 113 and below the insulated layer 114. The first electrode 111a and the second electrode 111b are separated by a chamber 102 in which a resonator 103 is disposed. The resonator 103 is separated by gaps from the first and second electrodes 111a and 111b. A shell 104 is disposed on the insulated layer 114 and over the resonator 103, so that the shell 104 seals the chamber 102.

The shell 104 includes a first layer 105, a second layer 106, and a third layer 107. The first layer 105 is disposed over the insulated layer 114. The second layer 106 is disposed over the first layer 105. The third layer 107 is disposed over the second layer 106. A through-hole 108 is disposed in the first layer 105.

For example, the through-hole 108 disposed in the first layer 105 is a flow path in which etching liquid flows in a process of forming the chamber 102. After the through-hole 108 is used as a flow path in which etching waste liquid flows, the through-hole 108 is filled up with a sealing material 109 with no space in the through-hole 108.

The resonant transducer 100 measures stress (deformation) applied to the resonator 103 by detecting a change of resonant frequency of the resonator 103. Specifically, in a case where the resonant transducer 100 is used as a pressure sensor, the resonant transducer 100 measures the strain by the deformation of the measurement diaphragm on which pressure is applied to one side or both sides of the measurement diaphragm. Then it is necessary that the shell 104 is strongly-constructed enough for the pressure to be measured.

Figure 26:
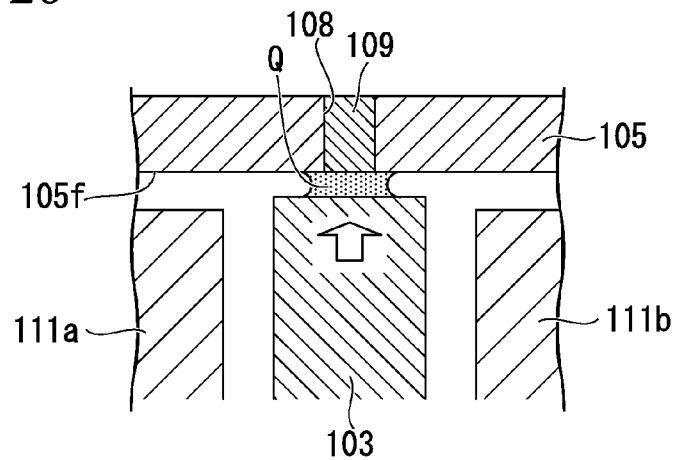
FIG. 26 is a drawing for describing a behavior of a droplet in the manufacturing method of the resonant transducer in the related art.

The resonant transducer 100 described above uses liquid in a process of discharging the etching waste liquid and a process of washing after the discharge process. As shown in FIG. 26, if a droplet Q of the liquid remains between the resonator 103 and the first layer 105 including the through-hole 108, the resonator 103 is drawn to a side 105f of the first layer 105 by meniscus force of the liquid. As the result, the resonator 103 adheres to the first layer 105. Therefore, it remains possible that the resonant transducer 100 cannot detect the stress.

Also, in a process of filling up the through-hole 108 with no space in the through-hole 108, the bigger a diameter of the through-hole 108 is, the thicker a polysilicon layer accumulated in the chamber 102 is. The polysilicon layer accumulated in an interspace between the resonator 103 and the electrodes 111a and 111b lying at each side of the resonator 103 causes a variation of magnitude of an output signal and a variation of resonant frequency of the resonator 103. Also, it remains possible that the electrodes 111a and 111b are shorted by the polysilicon layer accumulated in the chamber 102, and the resonant transducer 100 cannot output the output signal.

Further, when measuring a high pressure as a pressure sensor, there is a problem described below. The shell 104 bends toward the resonator 103 by the high pressure, and a distance between the shell 104 and the resonator 103 is changed. This change has an effect on electric field strength around the resonator 103. By the effect, electrostatic attractive force generated in the resonator 103 is changed. Also, the resonant frequency of the resonator 103 is slightly changed. Further, a characteristic indicating a relation of the deformation of the resonator 103 and the change of the resonant frequency of the resonator 103 is changed. Therefore, it remains possible that measurement deviation increases and measurement accuracy is worse.

The present invention will be now described herein with reference to illustrative preferred embodiments. Those skilled in the art will recognize that many alternative preferred embodiments can be accomplished using the teaching of the present invention and that the present invention is not limited to the preferred embodiments illustrated herein for explanatory purposes.

A resonant transducer and a manufacturing method therefor according to embodiments of the present invention will be described below in detail, with references to the drawings. The present embodiment is described in detail in order to make the scope of the invention easier to understand, and the present embodiment does not limit the present invention inasmuch as there are no particular specifications. Some of the drawings used in the following description show enlarged views of significant portions for the sake of convenience in order to make the characteristics of the present invention easier to understand, and the dimensional ratios and other features of the constituent elements are not meant to be limited to those presented herein.

A Resonant Transducer: First Embodiment

Figure 1:
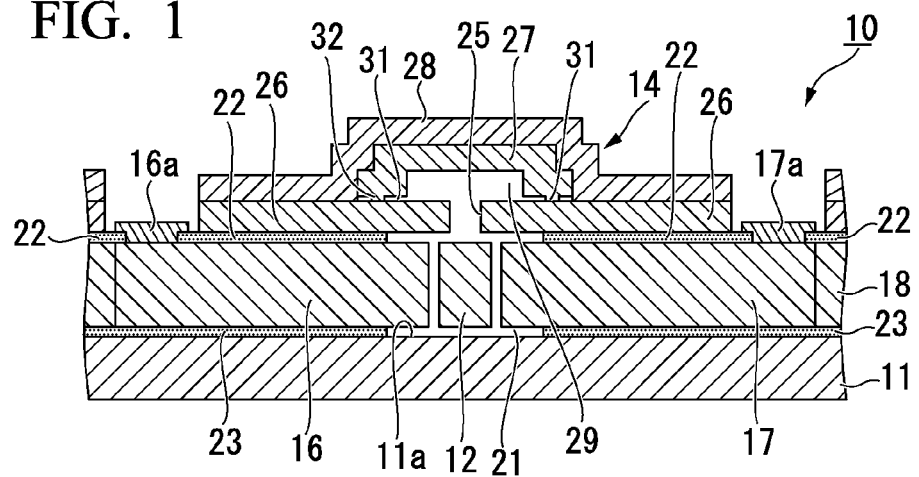
FIG. 1 is a sectional view illustrating the resonant transducer of a first embodiment.
Figure 2:
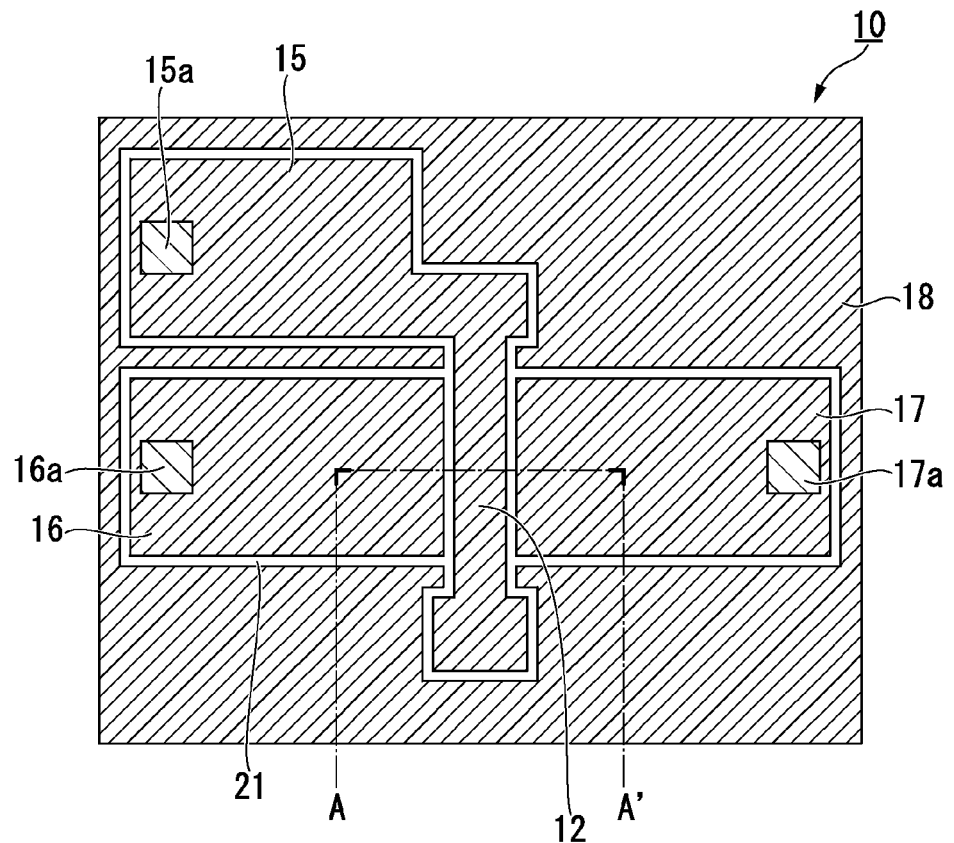
FIG. 2 is a plane view illustrating the resonant transducer of the first embodiment.

FIG. 1 is a sectional view illustrating the resonant transducer 10 of a first embodiment along a thickness direction. FIG. 2 is a plane view illustrating the resonant transducer 10 of the first embodiment without a shell. The resonant transducer 10 of an exemplary embodiment of the present invention includes a resonator 12 disposed on a substrate 11 made of silicon single crystal. Interspaces exist around the resonator 12. Also, the resonant transducer 10 includes a shell 14 surrounding the resonator 12 with the substrate 11 and zoning a chamber 21. The shell 14 is a multi-layer structure for the resonant transducer 10.

The chamber 21 is disposed on a side 11a of the substrate 11. The resonator 12, a first electrode 15, a second electrode 16, and a third electrode 17 are disposed in the chamber 21. Also, epitaxial layer 18 is disposed out of the chamber 21. The epitaxial layer 18, the resonator 12, the first electrode 15, the second electrode 16, and the third electrode 17 are made of same material such as a boron-doped low resistance P-type semiconductor.

The resonator 12 is integral with the first electrode 15 and electrically connected to the first electrode 15. When viewed from the shell 14, the resonator 12 is substantially narrow plate-like structure. A length of the resonator 12 in the thickness direction of the epitaxial layer 18 is longer than a width of the resonator 12 in a planar direction of the substrate 11. Also, predetermined tensile stress against the substrate 11 is added to the plate-like resonator 12. One end of the resonator 12 is integrally connected to the first electrode 15.

The second electrode 16 and the third electrode 17 are substantially rectangular-shaped member. The second electrode 16 and the third electrode 17 are disposed in both sides of the resonator 12 in a longitudinal direction keeping predetermined gap from the resonator 12. Connection points 15a, 16a, and 17a to be connected to an external electrical circuit are respectively disposed on the first electrode 15, the second electrode 16, and the third electrode 17. For example, the connection points 15a, 16a, and 17a are made of conductive metal.

Although insulated layer 22 is disposed between each of the electrodes 15 to 17 and the shell 14, the insulated layer 22 is not disposed in the chamber 21. Also, although insulated layer 23 is disposed between each of the electrodes 15 to 17 and the substrate 11, the insulated layer 23 is not disposed in the chamber 21. In a manufacturing process of the resonant transducer, the insulated layer 23 is formed by using a SOI substrate as the substrate 11. The manufacturing process of the resonant transducer will be described in detail.

Inside of the chamber 21 is kept in a predetermined degree of vacuum. For example, pressure in the chamber 21 is less than or equal to several tens of Pa so that measurement accuracy of the resonant frequency can be improved by suppressing energy loss of the resonator in a resonant state. The resonator 12, the first electrode 15, the second electrode 16, and the third electrode 17 are disposed leaving predetermined gap from members surrounding the chamber 21. The members surrounding the chamber 21 are the substrate 11, the epitaxial layer 18, and the shell 14.

Figure 3:
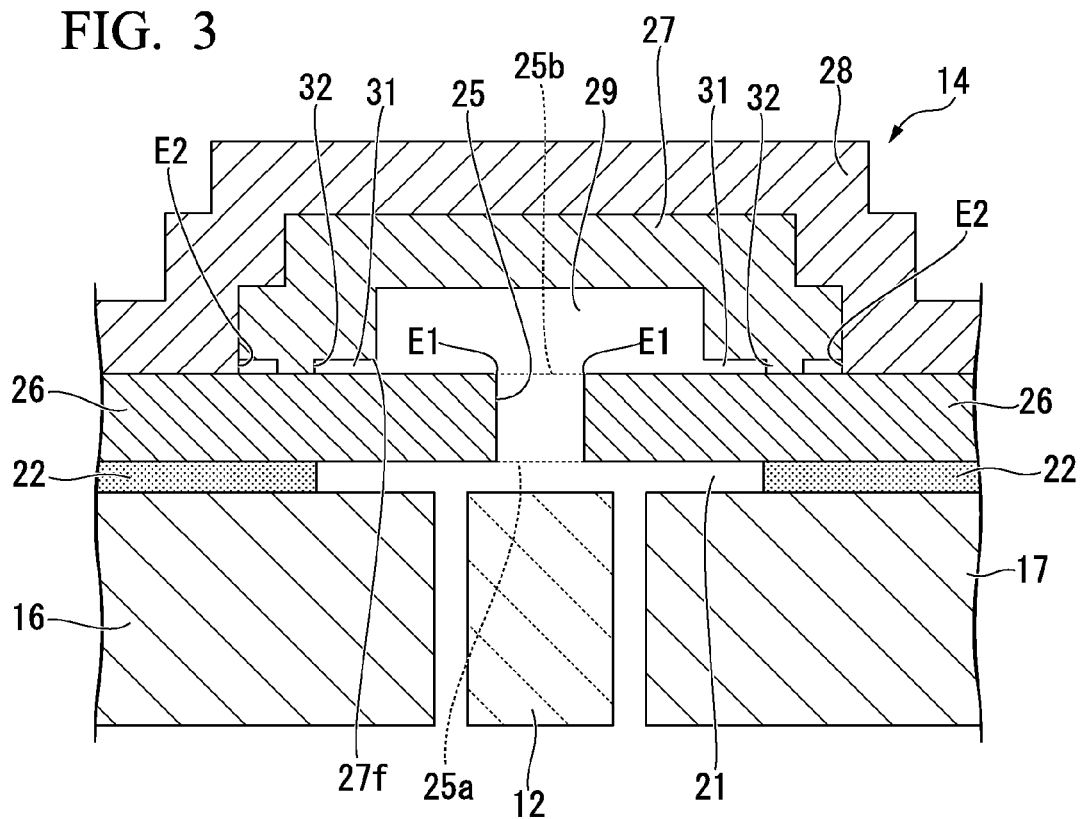
FIG. 3 is a zoomed sectional view around a main part of a resonator and a shell.

FIG. 3 is a zoomed sectional view around the resonator and shell. The shell 14 includes a first layer 26, a second layer 27, and a third layer 28. The first layer 26 is disposed over the insulated layer 22. The second layer 27 is disposed over the first layer 26. The third layer 28 covers the first layer 26 and the second layer 27. For example, the first layer 26, the second layer 27, and the third layer 28 are made of any one of polysilicon, amorphous silicon, SiC, SiGe, and Ge.

The first layer 26 is in contact with the chamber 21 and the insulated layer 22. A through-hole 25 is positioned at an overlapped part of the first layer 26 and the chamber 21. For example, the through-hole 25 is positioned immediately above the resonator 12. The through-hole 25 extends along a thickness direction of the first layer 26. In following description, an opening portion of the through-hole 25 at a side of the chamber 21 may be called a first opening portion 25a. Also, opening portion of the through-hole 25 at a side of the second 27 may be called a second opening portion 25b.

Figure 4:
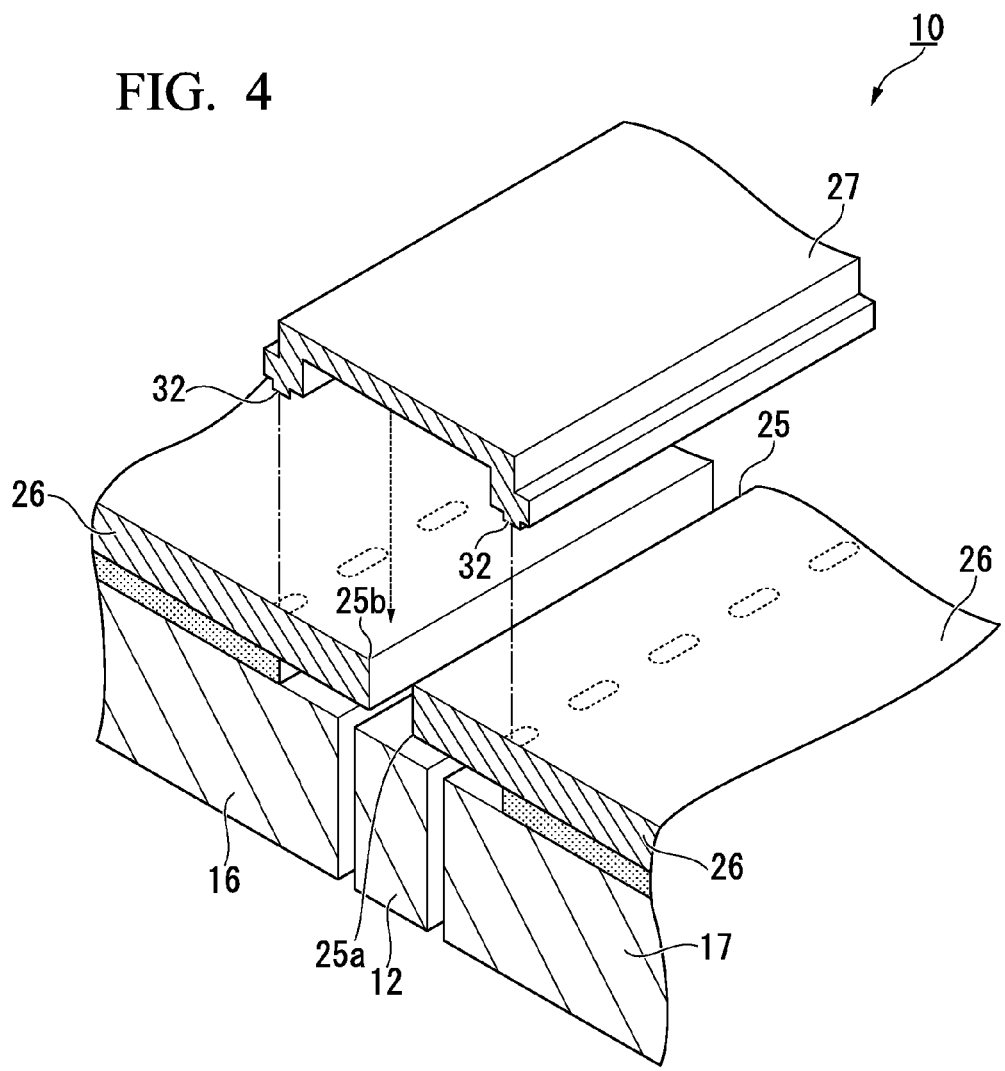
FIG. 4 is a zoomed diagrammatic perspective view illustrating a shape of a through-hole.

In the present embodiment, as shown in FIG. 4, when viewed from the third layer 28, the first opening portion 25a and the second opening portion 25b of the through-hole 25 are rectangular-shaped sections extending along the resonator 12. More specifically, the through-hole 25 is a cuboid-shaped narrow space extending along a longitudinal direction of the resonator 12.

In reference to FIG. 3 again, the second layer 27 is disposed near the second opening portion 25b of the through-hole 25, and covers around the second opening portion 25b. Specifically, the second layer 27 extends along a longitudinal direction of the through-hole 25 around the second opening portion 25b in predetermined width.

The third layer 28 covers the first layer 26 and the second layer 27. Specifically, the third layer 28 is in contact with the second layer 27 in an area where the second layer 27 exists. Also, the third layer 28 is in contact with the first layer 26 in outside the second layer 27.

In the shell 14 having the foregoing multi-layer structure, a gap 31 is positioned between the first layer 26 and the second layer 27. The second layer 27 is separated from the first layer 26 and the through-hole 25 by the gap 31 communicated with the through-hole 25. The gap 31 extends from a first position E1 of the through-hole 25 on a side of the second opening portion 25b to a second position E2 between the first layer 26 and the second layer 27. Further, the second layer 27 has a space 29 which is a concave space extended from a face 27f facing the first layer 26 toward a third layer 28.

Specifically, in the sectional view shown in FIG. 1, the gap 31 is a narrow space along the facing area of the first layer 26 and the second layer 27. The space 29 is a part of the gap 31 widely extended. Also, the space 29 is a concave space on the second layer. The space 29 is positioned over the through-hole 25 and between the first layer 26 and the second layer 27.

For example, the gap 31, that is to say, width between the first layer 26 and the second layer 27 may be a distance where etching liquid used in a process of forming the chamber 21 can flow in and flow out.

Non-empty spacers 32 are disposed on the second layer 27. The spacers 32 are integral with the second layer 27. The spacers 32 project from the second layer 27. End faces of the spacers 32 come into contact with the first layer 26. The spacers 32 keep the gap 31 to prevent the gap 31 from being narrowed by stress. A height of the spacer 32 is substantially equal to the gap 31.

As shown in FIG. 4, the spacers 32 are disposed along the longitudinal direction of the through-hole 25 in an area where the gap 31 exists. Liquid flowing in the gap 31 (shown in the FIG. 3) such as the etching liquid flows between the spacers 32. For this reason, the spacers 32 form the gap 31, and prevent interrupting the flow of the liquid. In the present embodiment, each of the spacers 32 is long cylindroid-shaped.

Figure 5:
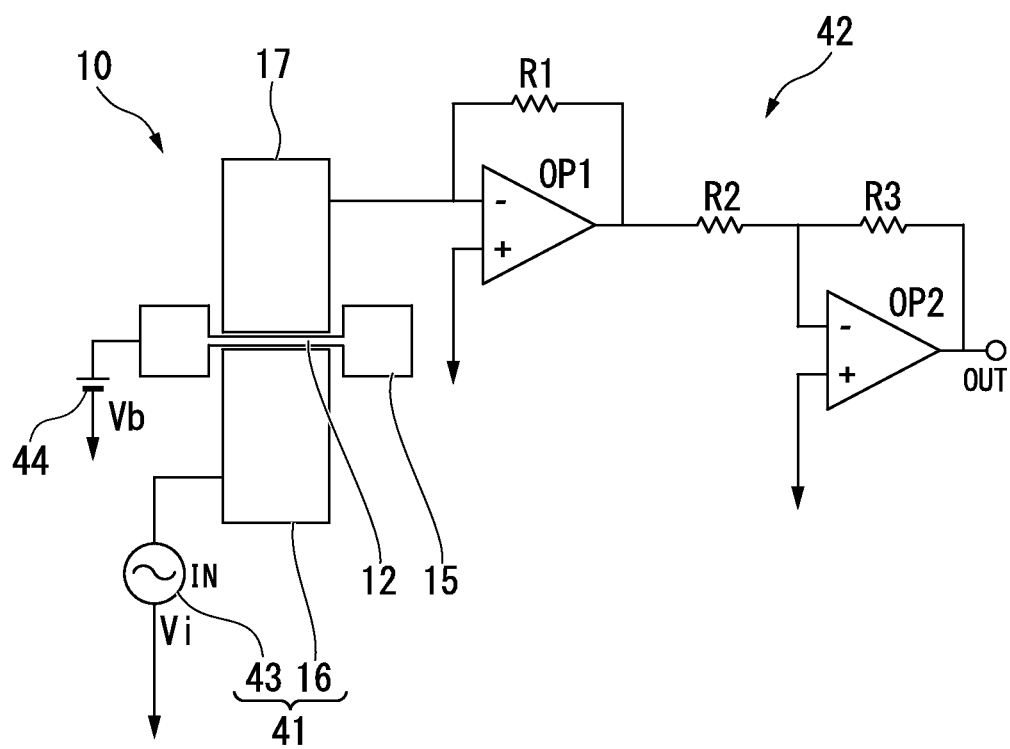
FIG. 5 is a circuit diagram illustrating the resonant transducer.

FIG. 5 is a circuit diagram of the resonant transducer. The resonant transducer 10 includes an exciting module 41 for exciting the resonator 12 and a vibration detecting module 42 for detecting vibration of the resonator 12. The exciting module 41 includes the second electrode 16 and a drive electrical source 43. The vibration detecting module 42 includes the first electrode 15, the third electrode 17, a bias electrical source 44, resistors R1, R2, and R3, operational amplifiers OP1 and OP2, and so on.

The drive electrical source 43 applies alternating-current voltage of predetermined drive voltage Vi. The bias electrical source 44 applies direct-current voltage of predetermined vias voltage Vb. The first electrode 15 is applied the constant vias voltage Vb from the bias electrical source 44. The second electrode 16 is applied the alternating drive voltage Vi from the drive electrical source 43. Detection signals according to vibrational frequency of the resonator 12 is output from the third electrode 17.

Operations of the resonant transducer are described below. After the constant vias voltage Vb is applied to the first electrode 15 and the alternating drive voltage Vi is applied to the second electrode 16, electrostatic suction power is generated between the resonator 12 connected to the first electrode 15 and the second electrode 16. At the time, the resonator 12 vibrates (resonates) at constant vibration frequency.

On the other hand, electrical charge is generated between the resonator 12 connected to the first electrode 15 and the third electrode 17 by the bias voltage Vb applied to the first electrode 15. When electrostatic capacity between the resonator 12 and the third electrode 17 is changed in accordance with vibration of the resonator 12, a detection signal according to the change of the electrostatic capacity is generated. The detection signal is alternating current. The operational amplifiers OP1 and OP2 amplify the detection signal. A counter reads the detection signal amplified by the operational amplifiers OP1 and OP2 as a voltage change so that the vibrational frequency of the resonator 12 can be measured.

When the resonator 12 is stressed, a strain of the resonator 12 is changed in accordance with an amount of the stress. And the vibrational frequency of the resonator 12 is changed in accordance with an amount of the strain. An amount of the strain of the resonator 12, that is to say, the stress applied to the resonator 12 can be measured.

In the constitution, because it is possible to separate the second electrode 16 as an exciting electrode from the third electrode 17 as a detecting electrode, parasitic capacity between the second electrode 16 and the third electrode 17 decreases. As a result, cross talk of the drive voltage Vi on the detection circuit can be suppressed. Also, signal-to-noise ratio can be improved.

A Manufacturing Method of the Resonant Transducer: First Embodiment

A manufacturing method of the resonant transducer and an operation of the resonant transducer are described below.

FIG. 6 to FIG. 16 are zoomed sectional views of a main part of the resonant transducer for describing the manufacturing method of the resonant transducer in stages. Also, FIG. 6 to FIG. 16 are sectional views along a line A-A' in FIG. 2.

Figure 6:
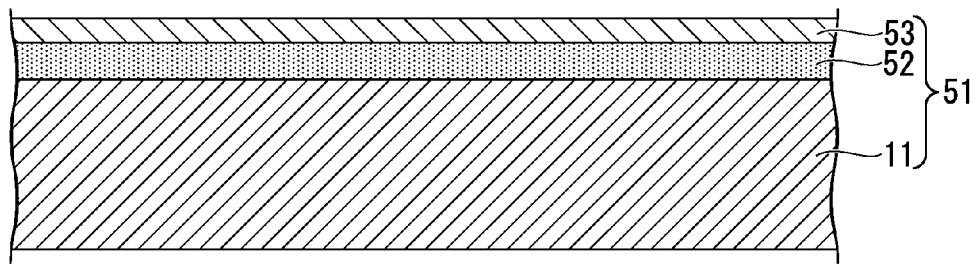
FIG. 6 is a sectional view illustrating the resonant transducer for describing a manufacturing method of the resonant transducer of the first embodiment.

First, as shown in FIG. 6, a SOI substrate 51 where an oxidized layer 52 and a superficial silicon layer 53 are formed on the substrate 11 is prepared. For example, a thickness of the oxidized layer 52 is about 2 micrometers. Also, a thickness of the superficial silicon layer 53 is about 1 micrometer.

Figure 7:
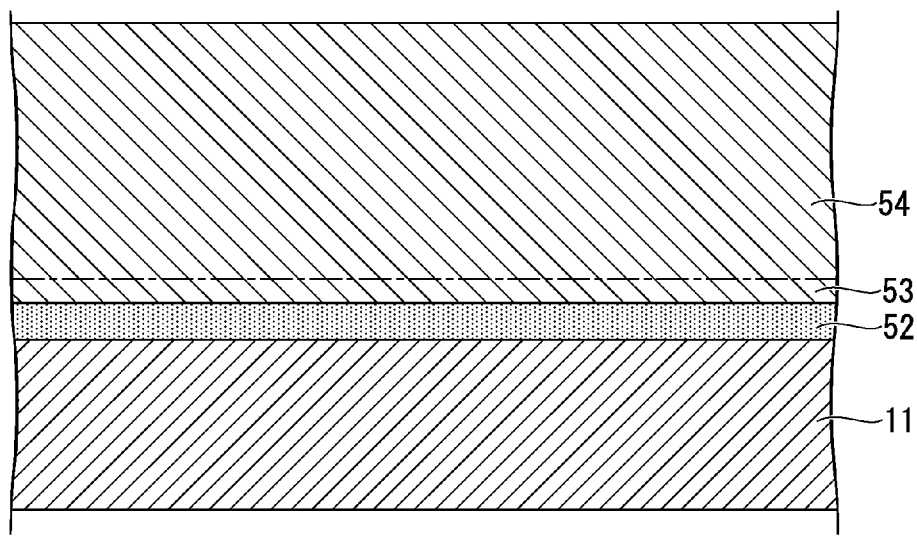
FIG. 7 is a sectional view of the resonant transducer for describing a manufacturing method of the resonant transducer of the first embodiment.

Next, as shown in FIG. 7, an epitaxial silicon layer 54 including a high level of boron is formed on the superficial silicon layer 53 by epitaxial growth. The epitaxial silicon layer 54 including a high level of boron is low electrical resistance and behaves like a conductor. In post-process, the resonator 12, the first electrode 15, the second electrode 16, and the third electrode 17 (shown in FIG. 2) are formed in the epitaxial silicon layer 54.

Also, as the epitaxial silicon layer 54 including a high level of boron has grater tension stress than the substrate 11, the epitaxial silicon layer 54 generates tension to the resonator 12 formed in the post-process. When the stress is applied to the resonator 12 in a tension condition, the stress is proportional to a square of frequency, an extremely linear characteristic is obtained. On the other hand, as an operation in a compression stress condition has a non-linear characteristic, an operation of the resonant transducer 10 is performed in a tension stress condition.

As a growth condition of the epitaxial silicon layer 54 including a high level of boron is (a) to (d) described below.
(a) growth temperature is 1030 degrees Celsius,
(b) in H2 gas,
(c) dichlorosilane (SiH2Cl2) is used as ingredient gas of silicon, and
(d) diborane (B2H6) is used as ingredient gas of boron which is an impurity.

Also, the epitaxial silicon layer 54 including a high level of boron is grown to, for example, about 9 micrometers by performing the epitaxial growth for predetermined time. Then a sum of the thickness of the epitaxial silicon layer 54 and the thickness of the superficial silicon layer 53 is about 10 micrometers.

Figure 8:
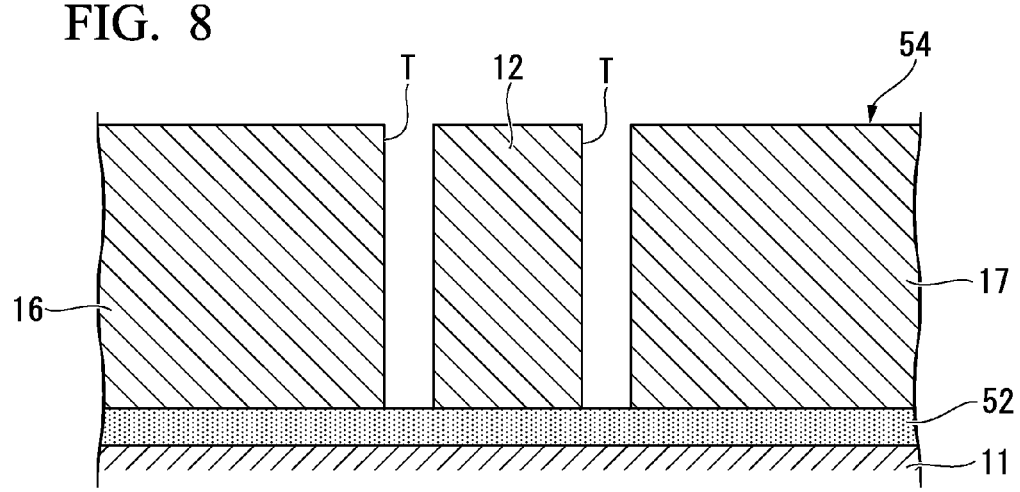
FIG. 8 is a sectional view of the resonant transducer for describing a manufacturing method of the resonant transducer of the first embodiment.

Next, as shown in FIG. 8, patterning of the epitaxial silicon layer 54 including a high level of boron is performed. Trenches T to become outline forms of the resonator 12, the first electrode 15 (shown in FIG. 2), the second electrode 16, and the third electrode 17 are formed on the epitaxial silicon layer 54. For example, the patterning of the epitaxial silicon layer 54 is performed by applying resist material. Also, the patterning is performed by a stepper apparatus.

For example, the stepper apparatus has resolution about 0.3 micrometers. Also, the stepper is capable of exposing submicron lines and spaces. The outline form pattern of the resonator 12, the first electrode 15, the second electrode 16, and the third electrode 17 are formed by the stepper apparatus.

The resist layer formed by the stepper apparatus is used as a mask, and the epitaxial silicon layer 54 is etched. The trenches T shaping the outline forms of the resonator 12, the first electrode 15, the second electrode 16, and the third electrode 17 are formed. For example, the epitaxial silicon layer 54 is etched by dry etching. The dry etching is performed until an etching position reaches the oxidized layer 52 on the substrate 11. The resonator 12, the first electrode 15, the second electrode 16, and the third electrode 17 are electrically separated each other.

In forming the trenches T by the dry etching, it is suitable that concave-convex portions are formed on a side wall of the trenches T by repeatedly performing a silicon etching process and a deposition process of a CF polymer. For example, stripes of which a width of the concave-convex portions is about 0.1 micrometer or more and a pitch of the concave-convex portions is about 0.1 to 1 micrometer are formed by adjusting an etching time and a deposition time.

Figure 9:
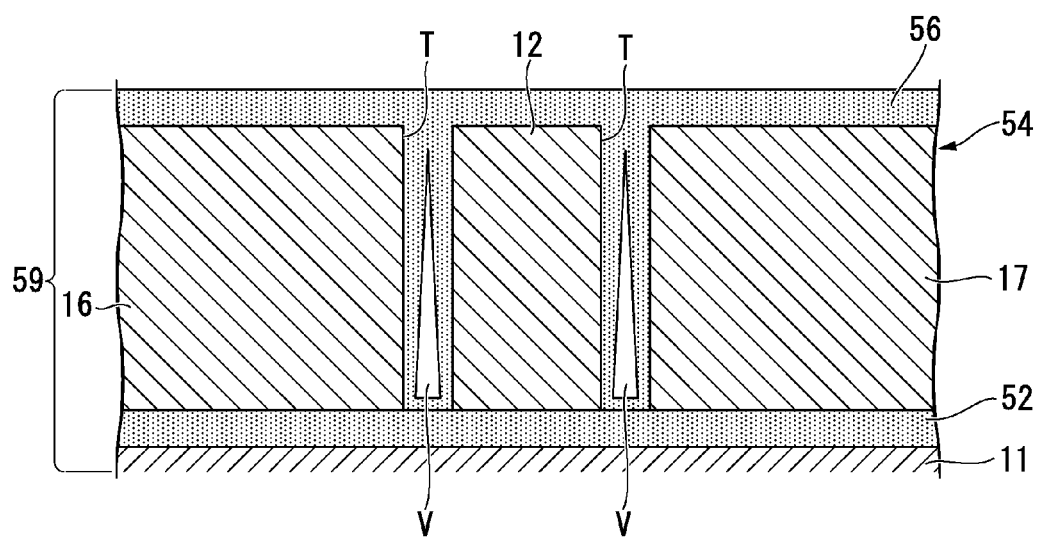
FIG. 9 is a sectional view of the resonant transducer for describing a manufacturing method of the resonant transducer of the first embodiment.

Next, as shown in FIG. 9, an insulated layer 56 is formed over the epitaxial silicon layer 54. The trenches T shaping the outline form of the resonator 12, the first electrode 15, the second electrode 16, and the third electrode 17 are filled with the insulated layer 56. The insulated layer 56 accumulates on the epitaxial silicon layer 54 by a predetermined thickness. For example, the insulated layer 56 is made of oxidized silicon. In forming the insulated layer 56, for example, open end portions of the trenches T are filled with a LP-CVD oxidized film or a plasma-CVD oxidized film of tetraethoxysilane (TEOS).

For example, the LP-CVD oxidized film is formed in a low pressure condition of 700 degrees Celsius and 50 Pascal by bubbling a TEOS tank, introducing nitrogen gas and oxygen gas, pyrolyzing the TEOS, and filling the trenches T with oxidized silicon.

The plasma CVD oxidized film is formed by a process of generating plasma by introducing TEOS and oxygen gas in vacuum, filling the trenches T with oxidized silicon on a substrate put on a stage heated to 400 degrees Celsius. As step coverage of the plasma CVD oxidized film is inferior in quality, the film is not easily formed in a deepest part of the trenches T and voids V are formed in a part of the insulated layer 56.

Figure 10:
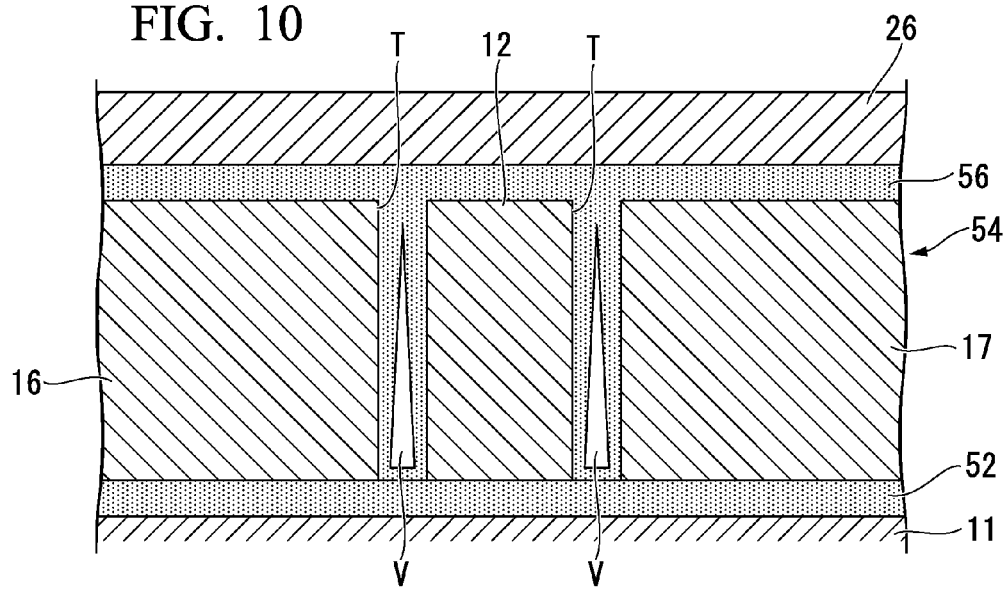
FIG. 10 is a sectional view of the resonant transducer for describing a manufacturing method of the resonant transducer of the first embodiment.

Next, as shown in FIG. 10, for example, the first layer 26 of which a thickness is several micrometers is formed over the insulated layer 56 covering the epitaxial silicon layer 54. The first layer 26 is a part of the shell covering the chamber 21 formed in the post-process. For example, the first layer 26 is made of any one of polysilicon, amorphous silicon, SiC, SiGe, and Ge.

Figure 11:
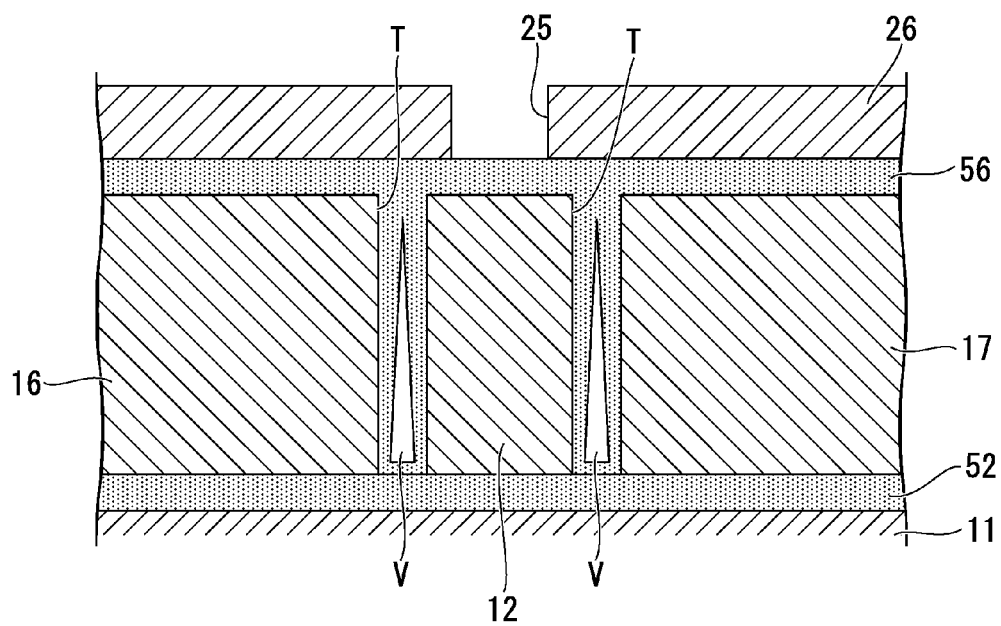
FIG. 11 is a sectional view of the resonant transducer for describing a manufacturing method of the resonant transducer of the first embodiment.

Next, as shown in FIG. 11, the through-hole 25 is formed in a part of the first layer 26. For example, the through-hole 25 is formed in a position facing the resonator 12, that is to say, a position immediately above the resonator 12. Also, for example, after forming the resist layer for shaping an outline form of the first layer 26, the through-hole 25 passing through the first layer 26 in a thickness direction is formed by the dry etching. For example, the through-hole 25 is a cuboid-shaped narrow space extending along the longitudinal direction of the resonator 12 (shown in FIG. 4).

Figure 12:
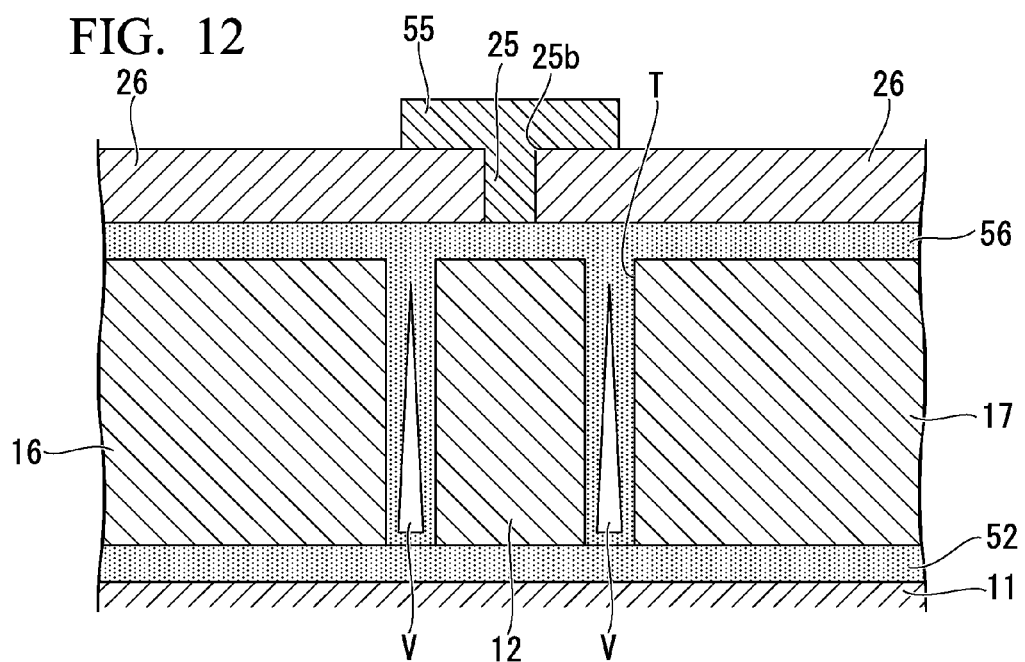
FIG. 12 is a sectional view of the resonant transducer for describing a manufacturing method of the resonant transducer of the first embodiment.

Next, as shown in FIG. 12, an oxide layer (first sacrifice layer) 55 is formed in the through-hole 25 and around the second opening portion 25b. For example, a LP-CVD apparatus forms the oxide layer 55 covering in and around the through-hole 25, and the oxide layer except around the through-hole 25 is removed by buffered HF with resist material to form the oxide layer 55.

Figure 13:
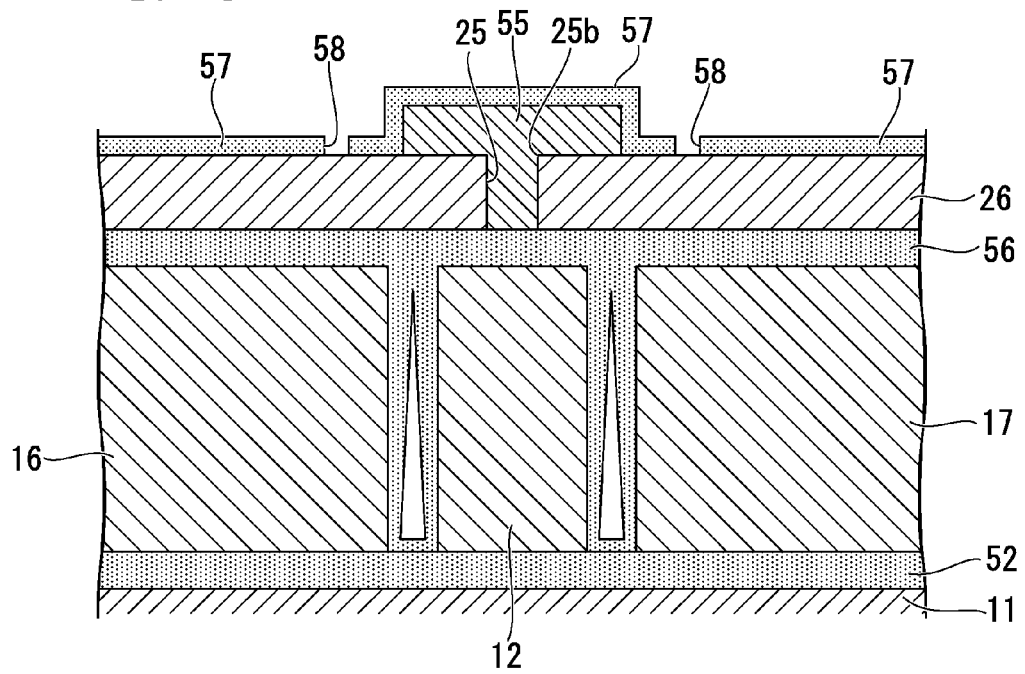
FIG. 13 is a sectional view of the resonant transducer for describing a manufacturing method of the resonant transducer of the first embodiment.

Next, as shown in FIG. 13, an oxide film (second sacrifice layer) 57 is formed. The oxide film 57 covers the oxide layer (first sacrifice layer) 55 and the first layer 26. Dimples 58 for forming outer shapes of the spacers 32 (shown in FIG. 3) of the second layer 27 are formed in a part of the oxide film 57, specifically around the second opening portion 25b of the through-hole 25.

For example, a LP-CVD apparatus forms an oxidized film 57 of which thickness is about 100 nanometers and the dimples 58 are formed by using resist material and removing only an area of the dimples 58 with buffered hydrofluoric acid.

Figure 14:
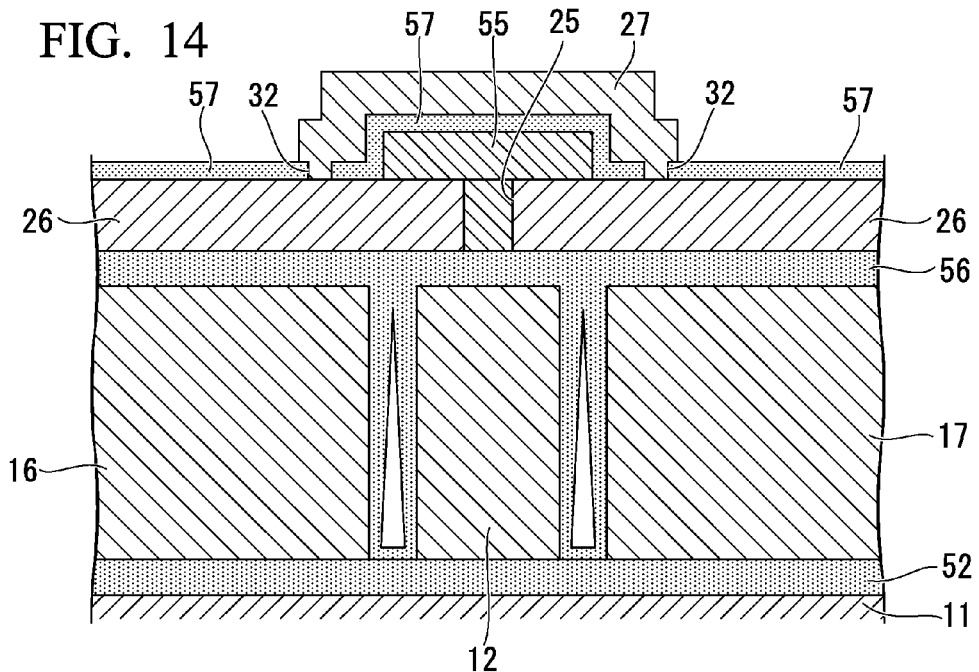
FIG. 14 is a sectional view of the resonant transducer for describing a manufacturing method of the resonant transducer of the first embodiment.

Next, as shown in FIG. 14, the second layer 27 is formed. The second layer 27 covers the oxide layer (first sacrifice layer) 55 and a part of the oxide film (second sacrifice layer) 57. The part of the oxide film 57 is a part in contact with the oxide layer 55. For example, the second layer 27 is made of any one of polysilicon, amorphous silicon, SiC, SiGe, and Ge. The spacers 32 is formed according to the shape of the dimples 58. The spacers are integral with the second layer 27.

Figure 15:
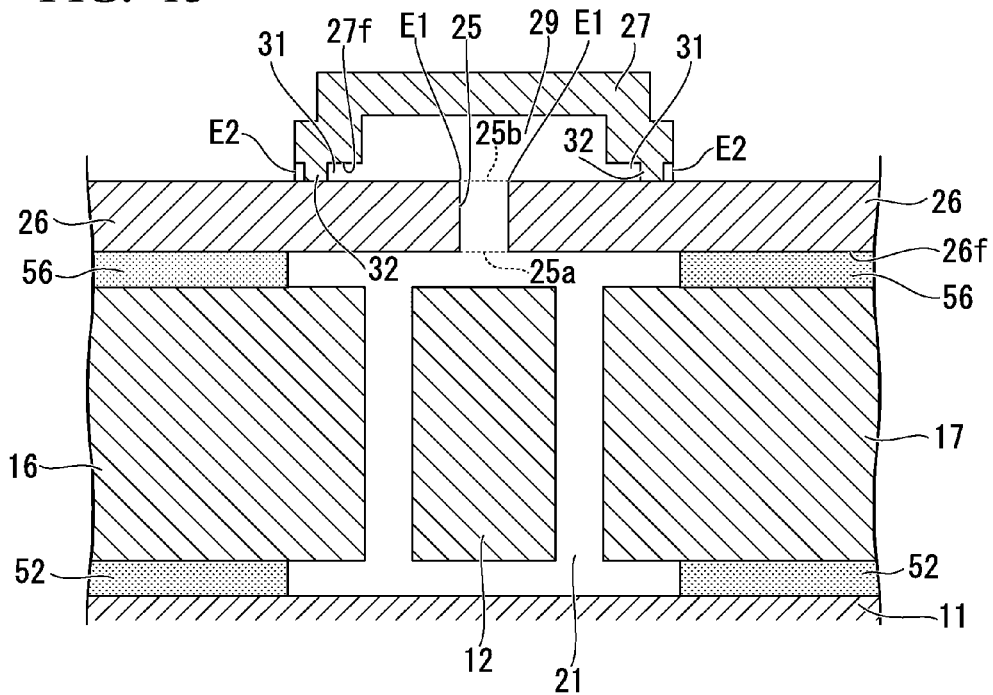
FIG. 15 is a sectional view of the resonant transducer for describing a manufacturing method of the resonant transducer of the first embodiment.

Next, as shown in FIG. 15, the oxide layer (first sacrifice layer) 55, the oxide film (second sacrifice layer) 57, the insulated layer 56 around the resonator 12, and the oxidized layer 52 around the resonator 12 are removed by etching with dilute HF solution (a process of discharging etching liquid used for forming the chamber from the gap to outside). By the process, a space to become the chamber 21 is formed around the resonator 12. Also, the space is kept around the resonator 12.

On the other hand, the through-hole 25 is formed by removing the oxide layer (first sacrifice layer) 55 and the oxide film (second sacrifice layer) 57 disposed between the first layer 26 and the second layer 27. Also, the gap 31 is formed between the first layer 26 and the second layer 27. The gap 31 extends from the first position E1 on a side of the second opening portion 25b of the through-hole 25 to the second position E2 between the first layer 26 and the second layer 27. Further, the second layer 27 has the space 29 which is a concave space extended from the face 27f facing the first layer 26 toward a third layer 28. The dilute HF solution reaches the insulated layer 56 around the resonator 12 and the oxidized layer 52 via the gap 31, the space 29, and the through-hole 25.

Waste solution of the dilute HF solution used for forming the chamber 21 by etching the insulated layer 56 and the oxidized layer 52 around the resonator 12 is discharged from inside of the chamber 21 to outside via the through-hole 25, the space 29, and the gap 31.

As described above, in the present embodiment, the through-hole 25 is formed in the first layer 26 immediately above the resonator 12, and a contact area of the resonator 12 and the first layer 26 is decreased. Therefore, even if the meniscus force is applied to the droplet remaining between the resonator 12 and the first layer 26 and the resonator 12 comes into contact with the first layer 26, it is preventable that the resonator 12 adheres to the first layer 26.

Figure 16:
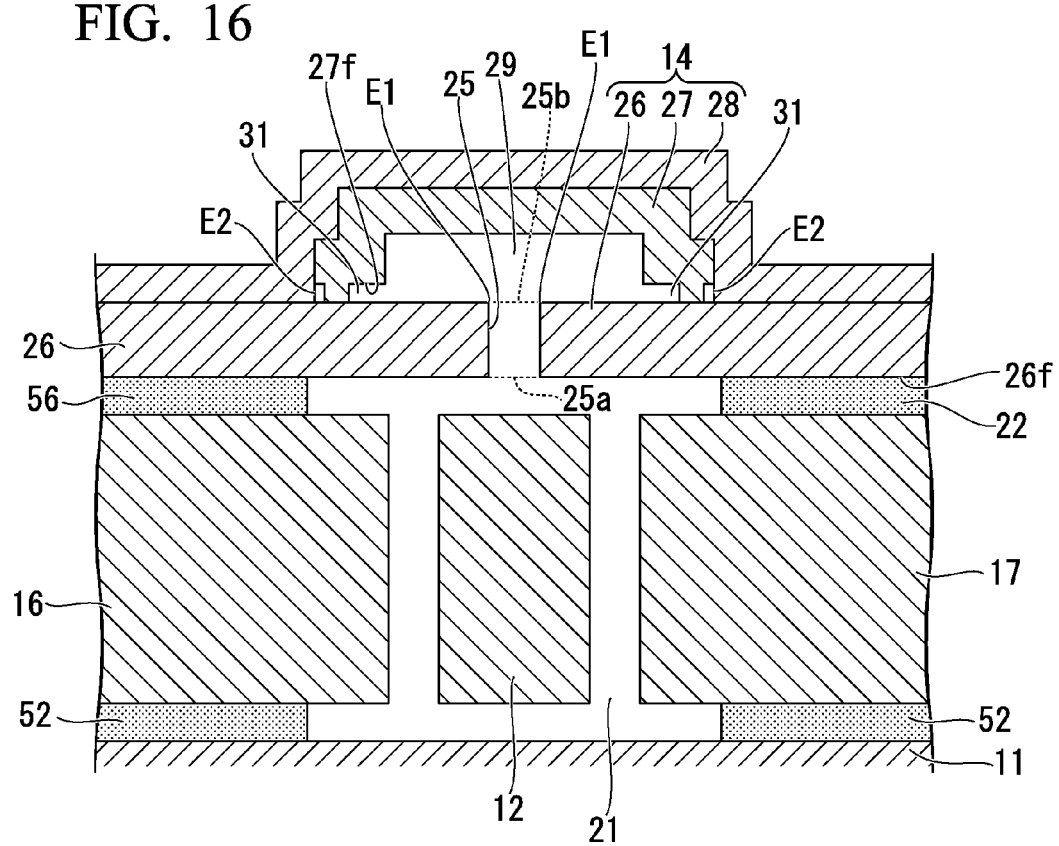
FIG. 16 is a sectional view of the resonant transducer for describing a manufacturing method of the resonant transducer of the first embodiment.

Next, as shown in FIG. 16, the third layer 28 is formed. The third layer 28 covers the first layer 26 and the second layer 27 for vacuum sealing. For example, the third layer 28 is made of any one of polysilicon, amorphous silicon, SiC, SiGe, and Ge. The vacuum sealing by the third layer 28 is performed in a condition that stretching strain is generated in the third layer 28 or remaining compression strain is very little. The vacuum sealing may be performed at 900 degrees Celsius. Also, the vacuum sealing may be performed 200 Torr by reduced pressure epitaxial apparatus. The vacuum sealing of the chamber 21 is performed by forming the third layer 28 with mixture of SiH4 and hydrogen as ingredient gas. After that, remaining hydrogen gas in the chamber 21 is diffused by annealing at 1000 degrees Celsius in nitrogen gas to more vacuumize.

After that, holes exposing the connection points 15a, 16a, and 17a (shown in FIG. 1 and FIG. 2) are formed at a position where the first layer 26 is in contact with the third layer 28.

As described above, in the resonant transducer, the manufacturing method therefor, and a multi-layer structure for a resonant transducer of the present embodiment, the through-hole 25 of the first layer 26 is disposed immediately above the resonator 12 so that the contact area of the resonator 12 and the first layer 26 can be decreased. Also, it is preventable that the resonator 12 bends and adheres to the first layer 26. Therefore, even if the meniscus force is applied to the droplet remaining between the resonator 12 and the first layer 26, it is preventable that the resonator 12 adheres to the first layer 26.

Also, as almost all the polysilicon layer in the chamber 21 can be restrained by the narrow gap 31 between the first layer 26 and the second layer 27, a variability of intensity of output signal, a variability of resonant frequency of the resonator 12, and output failure according to a short of electrodes are preventable.

Further, because the shell 14 is mechanically separated from the resonator 12 via the first layer 26 facing the resonator 12 and the space 29, the first layer 26 does not bend toward the resonator 12 by high pressure when measuring the high pressure as a pressure sensor. Therefore, it is preventable that the resonant frequency of the resonator 12 is changed according to a change of electrical field distribution. Further, it is preventable that linearity characteristic indicating a relation of the deformation and the change of the resonant frequency is worse.

Other embodiments of the resonant transducer will be described below. In each of the embodiments, same components as the first embodiment are numbered in the same manner as the first embodiment, and the explanation of the components are left out.

A Resonant Transducer: Second Embodiment

In the first embodiment, the through-hole 25 positioned in the first layer 26 is a cuboid-shaped narrow space extending along the longitudinal direction of the resonator 12. However, the shape of the through-hole 25 and the shape of the second layer 27 covering the through-hole 25 are not limited thereto.

Figure 17:
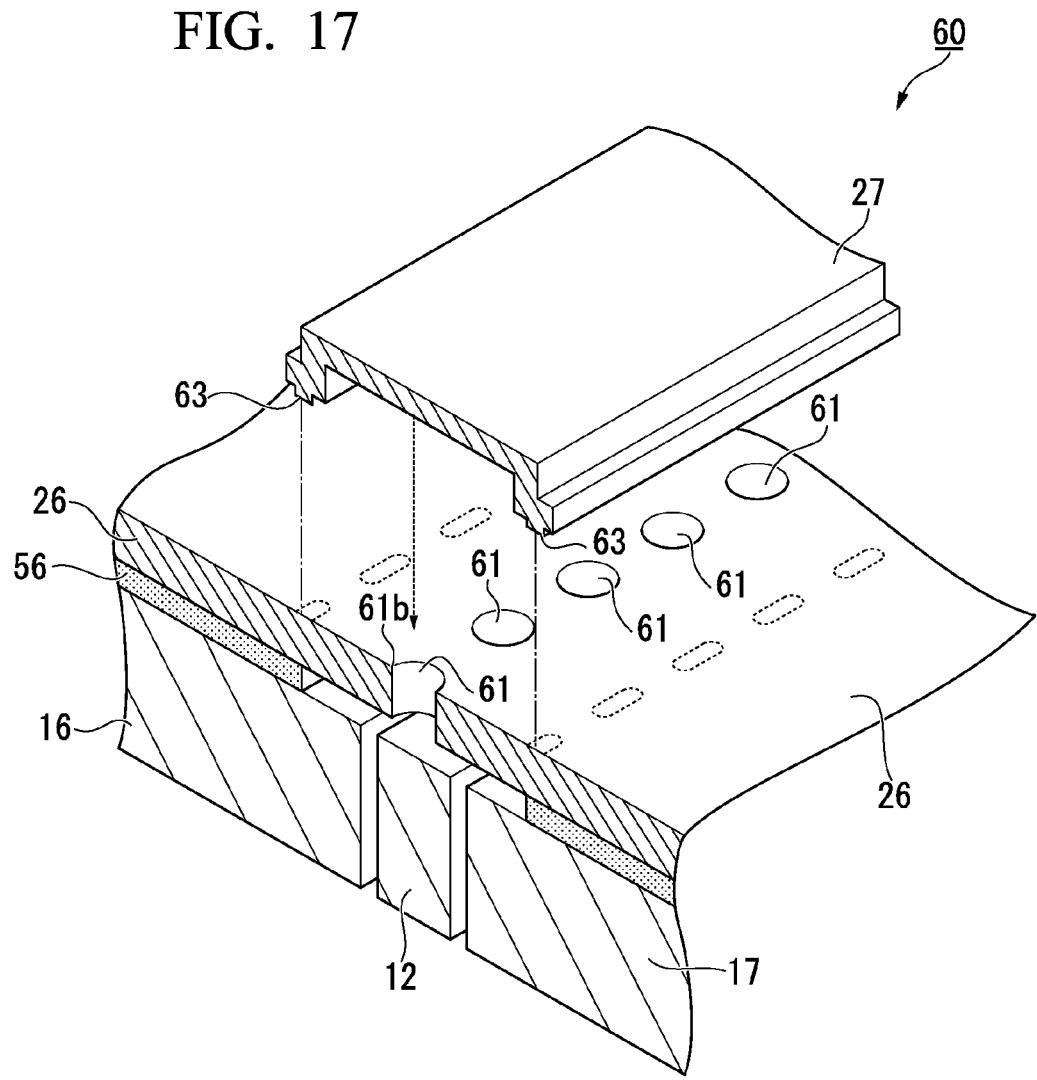
FIG. 17 is a zoomed diagrammatic perspective view illustrating a main part of the resonant transducer of the second embodiment.

In the resonant transducer 60 shown in FIG. 17, cylindrical-shaped through-holes 61 are positioned along the longitudinal direction of the resonator 12 on the first layer 26. Non-empty spacers 63 are integral with the second layer 27. The spacers 63 are in contact with the first layer 26 around second opening portions 61b of the through-holes 61. For example, in the resonant transducer 60 shown in FIG. 17, the spacers 63 are in contact with the first layer 26 at positions surrounding the second opening portions 61b of the through-holes 61.

A Resonant Transducer: Third Embodiment

Figure 18:
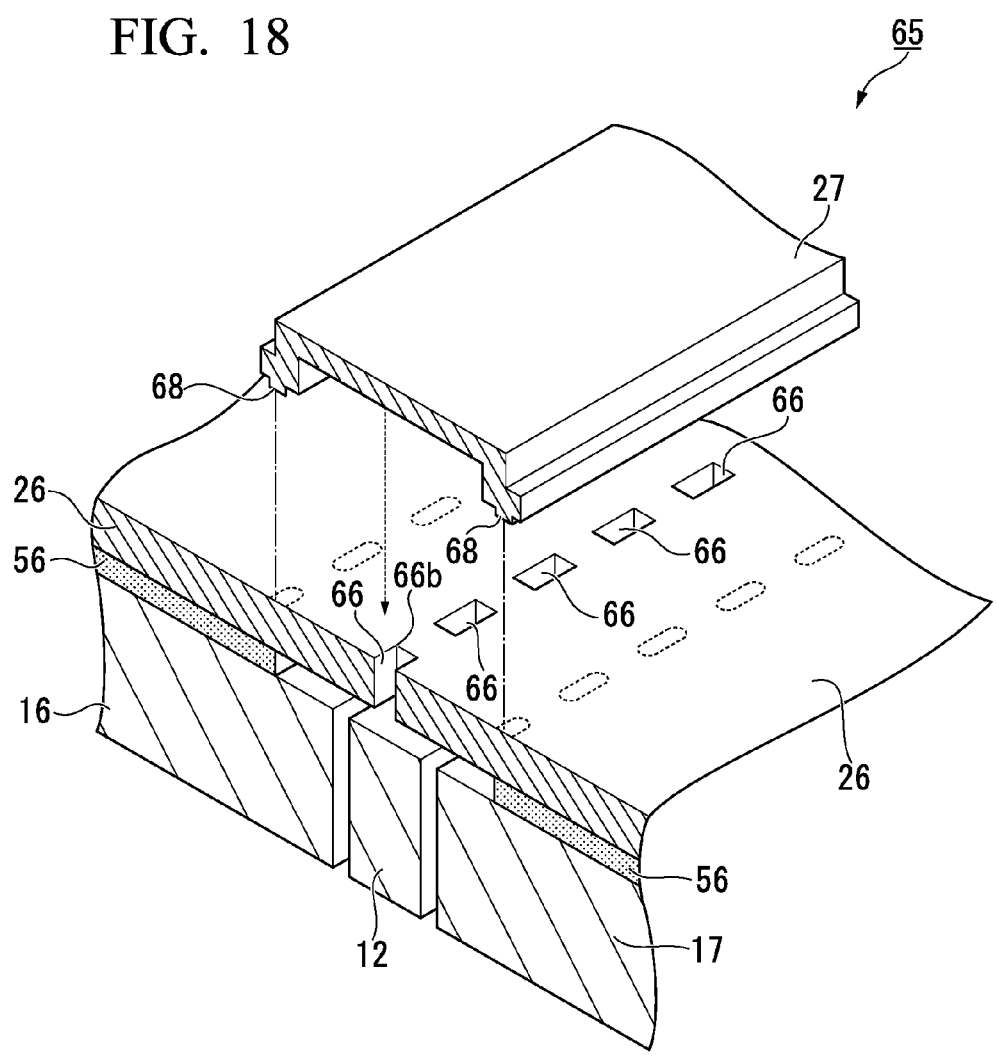
FIG. 18 is a zoomed diagrammatic perspective view illustrating a main part of the resonant transducer of the third embodiment.

In the resonant transducer 65 shown in FIG. 18, cuboid-shaped through-holes 66 are positioned along the longitudinal direction of the resonator 12 in the first layer 26. Non-empty spacers 68 are integral with the second layer 27.

The second layer 27 is in contact with the first layer 26 around second opening portions 66b of the through-holes 66. For example, in the resonant transducer 65 shown in FIG. 18, the spacers 68 are in contact with the first layer 26 at both sides along a longitudinal direction of the second opening portions 66b of the through-holes 66.

The shapes of the spacers forming the gap 31 (shown in FIG. 3) between the first layer 26 and the second layer 27 are not limited to the shapes shown in the first embodiment or the second embodiment. For example, the spacers may be irregular concavities and convexities formed on at least one of the first layer 26 and the second layer 27 to allow passage of fluid. In this case, the spacers may be rough surfaces on at least one of the first layer 26 and the second layer 27.

A Manufacturing Method of the Resonant Transducer: Second Embodiment

Figure 19:
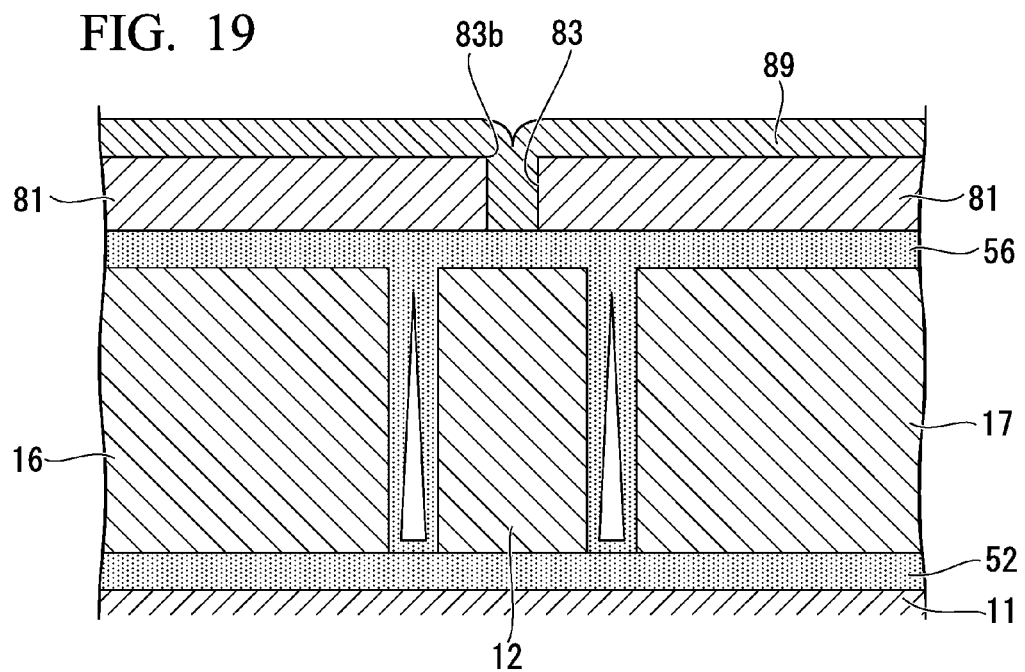
FIG. 19 is a sectional view illustrating the resonant transducer for describing a manufacturing method of the resonant transducer of the second embodiment.

FIG. 19 to FIG. 24 are zoomed sectional views of a main part of the resonant transducer for describing the manufacturing method of the resonant transducer in stages in a second embodiment. FIG. 19 is a drawing for describing a process corresponding to the FIG. 12 in the manufacturing method of the resonant transducer of the first embodiment. As shown in FIG. 19, an oxide layer (first sacrifice layer) 89 is formed in the through-hole 83 of the first layer 81 and around a second opening portion 83b.

Figure 20:
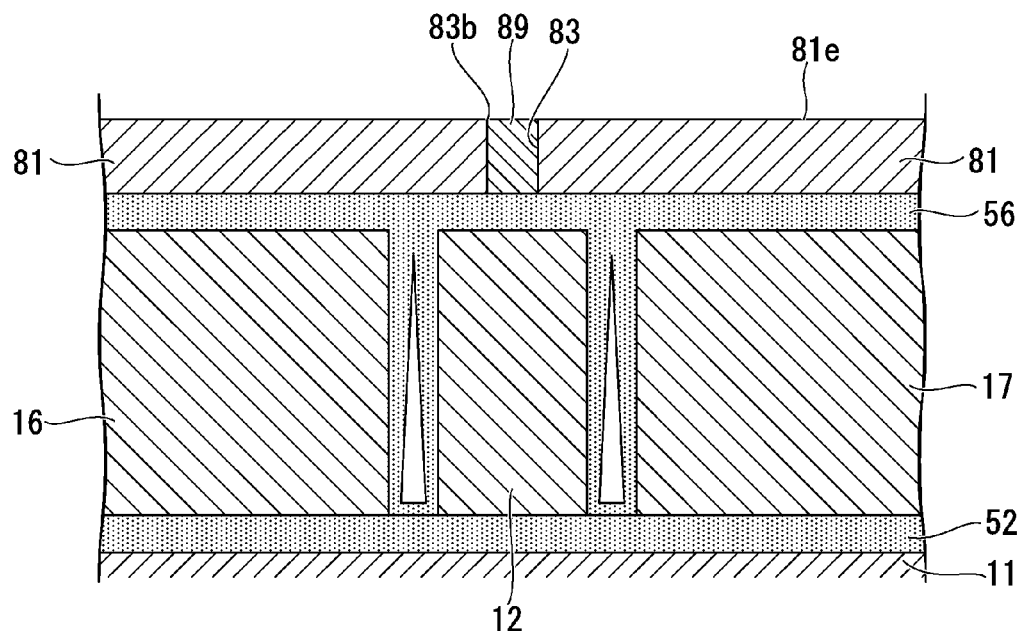
FIG. 20 is a sectional view illustrating the resonant transducer for describing a manufacturing method of the resonant transducer of the second embodiment.

Next, as shown in FIG. 20, a plane 81e of the first layer 81 is planarized. The 81e is an upper surface of the first layer 81. By the planarizing process, an outer side of the second opening portion 83b of the through-hole 83, that is to say, an upper side of the plane 81e of the first layer 81 is removed. Therefore, the oxide layer (first sacrifice layer) 89 is formed only inside of the through-hole 83.

Figure 21:
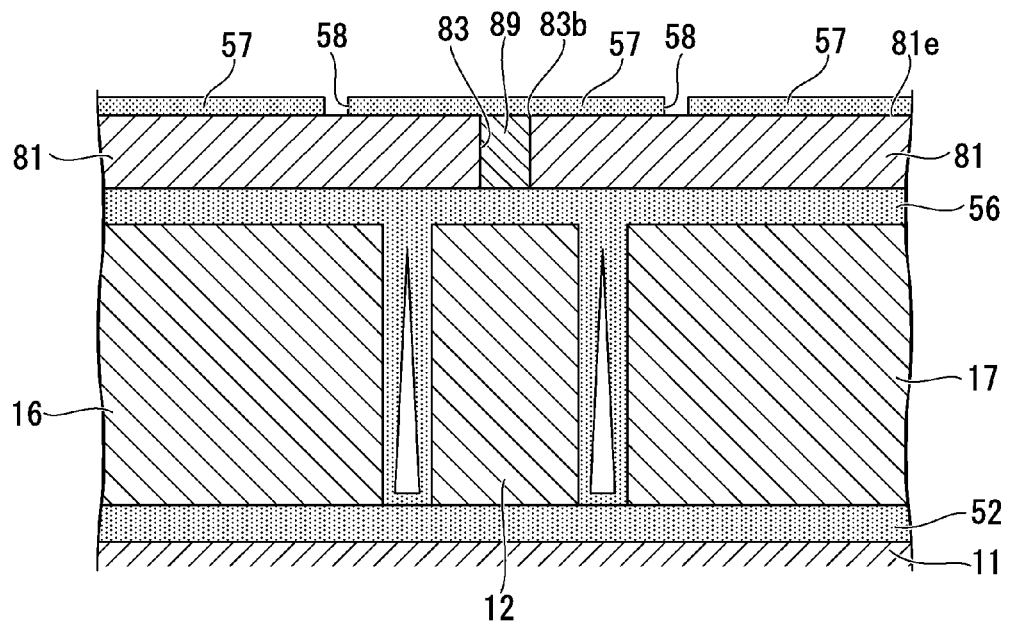
FIG. 21 is a sectional view illustrating the resonant transducer for describing a manufacturing method of the resonant transducer of the second embodiment.

Next, as shown in FIG. 21, an oxide film (second sacrifice layer) 57 is formed. The oxide film 57 covers the plane 81e of the first layer 81. Dimples 58 for forming outer shapes of the spacers 32 (shown in FIG. 3) of the second layer 87 are formed in a part of the oxide film 57, specifically around the second opening portion 83b of the through-hole 83.

Figure 22:
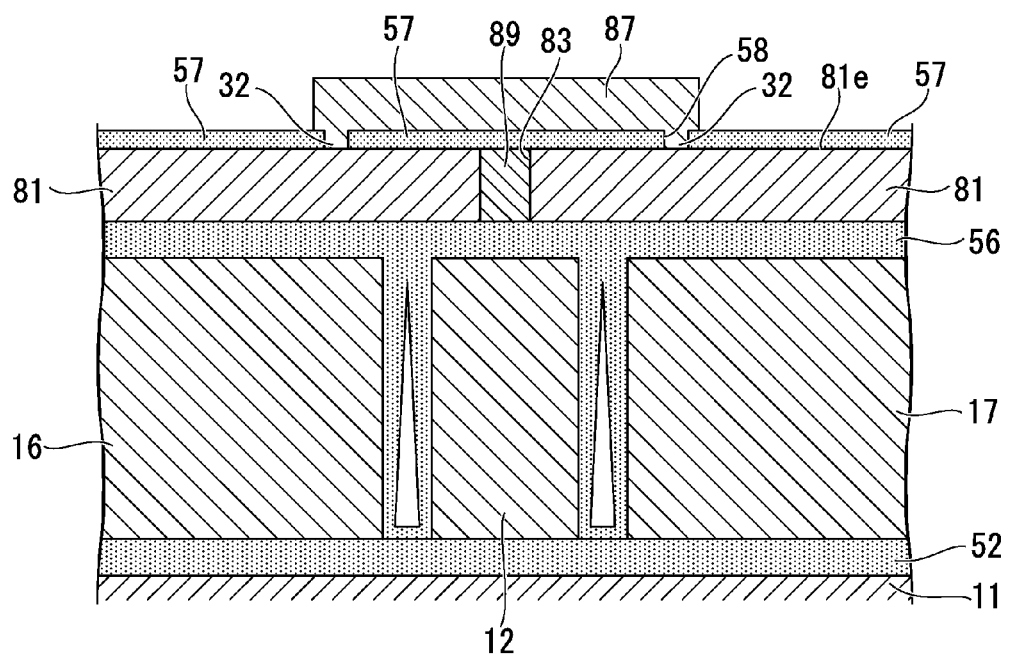
FIG. 22 is a sectional view illustrating the resonant transducer for describing a manufacturing method of the resonant transducer of the second embodiment.

Next, as shown in FIG. 22, the second layer 87 is formed. The second layer 87 covers around the through-hole 83. The spacers 32 are formed according to the shape of the dimples 58. The spacers 32 are integral with the second layer 87.

Figure 23:
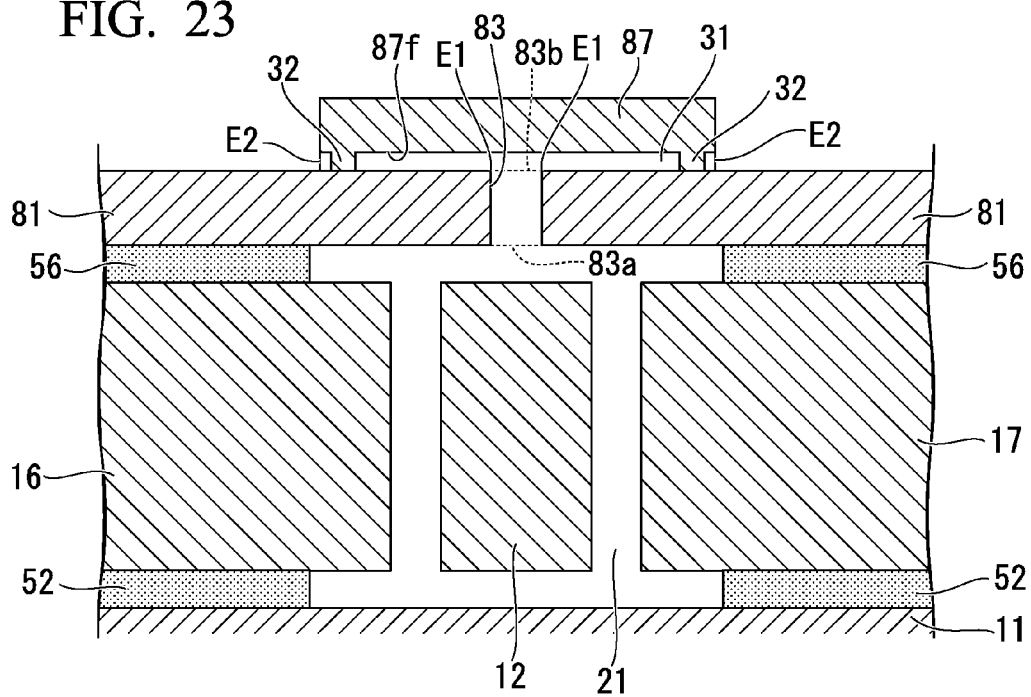
FIG. 23 is a sectional view illustrating the resonant transducer for describing a manufacturing method of the resonant transducer of the second embodiment.

Next, as shown in FIG. 23, the oxide layer (first sacrifice layer) 89, the oxide film (second sacrifice layer) 57, the insulated layer 56 around the resonator 12, and the oxidized layer 52 around the resonator 12 are removed by etching with dilute HF solution. By the process, the chamber 21 is formed around the resonator 12, and the gap is kept around the resonator 12.

On the other hand, the through-hole 83 is formed by removing the oxide layer (first sacrifice layer) 55 filled in the through-hole 83. Also, the gap 31 is formed between the first layer 81 and the second layer 87 by removing the oxide film (second sacrifice layer) 57 disposed between the first layer 81 and the second layer 87. The gap 31 extends from the first position E1 around the second opening portion 83b to the second position E2 between the first layer 81 and the second layer 87. A plane 87f is an under surface of the second layer 87 except for the spacer 32. In the present embodiment, the plane 87f is planarized, and a concave space is not formed on the plane 87f.

Figure 24:
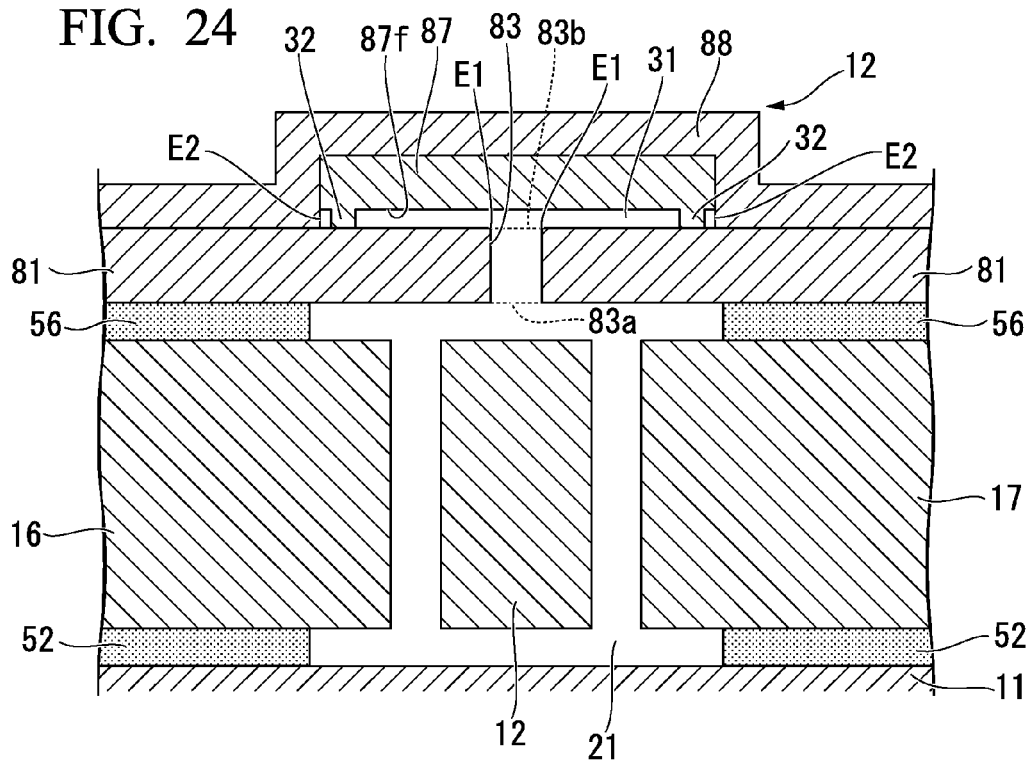
FIG. 24 is a sectional view illustrating the resonant transducer for describing a manufacturing method of the resonant transducer of the second embodiment.

Next, as shown in FIG. 24, the third layer 88 is formed. The third layer 88 covers the first layer 81 and the second layer 87 for vacuum sealing. Specifically, the third layer 88 seals the gap 31 at the position E2. The vacuum sealing by the third layer 88 is performed in a condition that stretching strain is generated in the third layer 28 or remaining compression strain is very little.

By the manufacturing method of the transducer, even if a droplet exists between the resonator 12 and the first opening portion 83a of the through-hole 83, the droplet can flow into the through-hole 83. Therefore, it is preventable that the resonator 12 adheres to the first layer 81 by the meniscus force of the droplet.

While preferred embodiments of the invention have been described and illustrated above, it should be understood that these are exemplary of the invention and are not to be considered as limiting. Additions, omissions, substitutions, and other modifications can be made without departing from the scope of the present invention. Accordingly, the invention is not to be considered as being limited by the foregoing description, and is only limited by the scope of the appended claims.

What is claimed is:

1. A resonant transducer comprising:
   a silicon single crystal substrate;
   a silicon single crystal resonator disposed over the silicon single crystal substrate;
   a shell made of silicon, surrounding the resonator with a gap, and forming a chamber together with the silicon single crystal substrate;
   an exciting module configured to excite the resonator; and
   a vibration detecting module configured to detect vibration of the resonator;
   wherein the shell comprises:
   a first layer disposed over the chamber, the first layer having a through-hole over the resonator;
   a second layer disposed over the first layer, the second layer covering a gap being positioned above the through-hole, the gap communicating from a first position at an upper side of the through-hole to a second position between the first layer and a peripheral portion of the second layer; and
   a third layer covering the first layer and the second layer, and the third layer sealing the gap at the second position.

2. The resonant transducer according to claim 1, wherein the first layer, the second layer, and the third layer are made of any one of polysilicon, amorphous silicon, SiC, SiGe, and Ge.

3. The resonant transducer according to claim 1, wherein the through-hole is positioned immediately above the resonator.

4. A resonant transducer comprising:
   a silicon single crystal substrate;
   a silicon single crystal resonator disposed over the silicon single crystal substrate;
   a shell made of silicon, surrounding the resonator with a gap, and forming a chamber together with the silicon single crystal substrate;
   an exciting module configured to excite the resonator;
   a vibration detecting module configured to detect vibration of the resonator;
   a first layer disposed over the chamber, the first layer having a through-hole over the resonator;
   a second layer disposed over the first layer, the second layer covering a gap being positioned above the through-hole and being communicated with the through-hole;
   a third layer covering the first layer and the second layer, and the third layer sealing the gap; and a non-empty spacer forming the gap, the non-empty spacer being integral with the second layer.

5. A resonant transducer comprising:

a silicon single crystal substrate;

a silicon single crystal resonator disposed over the silicon single crystal substrate;

a shell made of silicon, surrounding the resonator with a gap, and forming a chamber together with the silicon single crystal substrate;

an exciting module configured to excite the resonator;

a vibration detecting module configured to detect vibration of the resonator;

a first layer disposed over the chamber, the first layer having a through-hole over the resonator;

a second layer disposed over the first layer, the second layer covering a gap being positioned above the through-hole and being communicated with the through-hole; and a third layer covering the first layer and the second layer, and the third layer sealing the gap, wherein the gap has a concave space over the through-hole and between the first layer and the second layer.

6. The resonant transducer according to claim 1, wherein pressure in the chamber is less than atmospheric pressure.

7. The resonant transducer according to claim 1, wherein the resonant transducer is manufactured by a manufacturing method comprising:

(a) forming the resonator in a layered structure;

(b) forming the first layer over the layered structure;

(c) forming the through-hole in the first layer;

(d) forming a first sacrifice layer in the through-hole;

(e) forming a second sacrifice layer over the first sacrifice layer and the first layer;

(f) forming the second layer covering a part of the second sacrifice layer, the part covering the first sacrifice layer;

(g) forming the gap between the first layer and the second layer by removing the first sacrifice layer and the second sacrifice layer; and (h) forming the third layer covering the first layer and the second layer.

8. The resonant transducer according to claim 7, wherein the manufacturing method further comprises:

forming dimples in the second sacrifice layer in the step (e); and forming non-empty spacer integral with the second layer according to the shape of the dimples in the step (f), the non-empty spacer forming the gap.

9. A multi-layer structure for a resonant transducer, the multi-layer structure comprising:

a first layer having a through-hole;

a second layer disposed over the first layer, the second layer covering a gap being positioned above the through-hole and being communicated with the through-hole;

a third layer covering the first layer and the second layer, and the third layer sealing the gap; and a non-empty spacer forming the gap, the non-empty spacer being integral with the second layer.

10. A multi-layer structure for a resonant transducer, the multi-layer structure comprising:

a first layer having a through-hole;

a second layer disposed over the first layer, the second layer covering a gap being positioned above the through-hole and being communicated with the through-hole; and a third layer covering the first layer and the second layer, and the third layer sealing the gap, wherein the gap has a concave space over the through-hole and between the first layer and the second layer.

\* \* \* \* \*